United States Patent [19]
Walker

[11] Patent Number: 5,518,948
[45] Date of Patent: May 21, 1996

[54] METHOD OF MAKING CUP-SHAPED DRAM CAPACITOR HAVING AN INWARDLY OVERHANGING LIP

[75] Inventor: Michael A. Walker, Boise, Id.

[73] Assignee: Micron Technology, Inc., Boise, Id.

[21] Appl. No.: 534,572

[22] Filed: Sep. 27, 1995

[51] Int. Cl.$^6$ ............................................. H01L 21/8242
[52] U.S. Cl. ................... 437/60; 437/47; 437/228
[58] Field of Search ........................... 437/47, 60, 915, 437/919, 228; 148/DIG. 14

[56] References Cited

U.S. PATENT DOCUMENTS

| | | | |
|---|---|---|---|
| 5,164,337 | 11/1992 | Ogawa et al. | 437/228 O |
| 5,170,233 | 12/1992 | Liu et al. | 257/308 |
| 5,185,282 | 2/1993 | Lee et al. | 437/47 |
| 5,206,787 | 4/1993 | Fujioka | 257/307 |
| 5,229,314 | 7/1993 | Okudaira et al. | 437/60 |
| 5,240,871 | 8/1993 | Doan et al. | 437/47 |

FOREIGN PATENT DOCUMENTS

| | | |
|---|---|---|
| 4-69964A | 3/1992 | Japan . |
| 5-129548A | 5/1993 | Japan . |

Primary Examiner—Chandra Chaudhari
Attorney, Agent, or Firm—Holland & Hart; Angus C. Fox, III

[57] ABSTRACT

This invention is a cup-shaped capacitor having an inwardly-overhanging lip on the upper edge of the cylindrical wall portion of the cup, as well as a method for making the capacitor. The overhanging lip on the upper edge prevents sharpening of the upper edge during singulation of the storage-node capacitor plates and the attendant problems. The capacitor is formed by depositing a mold layer on a substrate, depositing an etch stop layer on top of the mold layer (the etch stop layer having an etch rate that is lower than that of the mold layer), enlarging the mold layer portion of the cavity such that the mold layer is recessed beneath the edge of the etch stop layer, depositing a first capacitive layer which covers the upper surface of the etch stop layer and fully lines the cavity, performing an isotropic etch-back step which removes at least the portion of the first capacitive layer which overlies the upper surface of the etch stop layer to form a singulated first capacitive plate, removing the etch stop layer, removing at least a portion of the mold layer to expose an outer surface of the first capacitive plate, depositing a dielectric layer, and depositing a second capacitive layer.

22 Claims, 4 Drawing Sheets

METHOD OF MAKING CUP-SHAPED DRAM CAPACITOR HAVING AN INWARDLY OVERHANGING LIP

FIELD OF THE INVENTION

This invention relates to integrated circuit manufacturing technology and, more specifically, to a low-cost process for manufacturing a cylindrically-shaped capacitor usable in a dynamic random access memory, the process employing a mold cavity having an overhanging lip to prevent faceting of the storage-node electrode.

BACKGROUND OF THE INVENTION

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital data, is comprised of two main components: a field-effect access transistor and a capacitor. Each new generation of DRAM devices generally has an integration level that is four times that of the generation which it replaced. Such a quadrupling of device number per chip is always accompanied by a decrease in device geometries, and often by a decrease in operating voltages. As device geometries and operating voltages are decreased, the DRAM designer is faced with the difficult task of maintaining cell capacitance at an acceptable level. This must be accomplished without resorting to processes that reduce product yield or that markedly increase the number of masking and deposition steps in the production process. All DRAM memories of 4-megabit and greater density utilize cell designs having three-dimensional capacitors. Although both trench and stacked capacitor designs have proven serviceable at the 4-megabit level, most manufacturers now seem to favor the stacked capacitor design for its manufacturability and somewhat higher yield. Cup-shaped capacitors which are formed in a cavity made in a sacrificial mold layer are proving to be very popular stack designs for 16-megabit and 64-megabit devices.

A problem associated with the formation of cup-shaped capacitors involves the singulation process whereby individual storage-node plates, which were formed from a single continuous layer of conductive material (generally doped polycrystalline silicon or doped amorphous silicon), are separated from one another. Singulation may be accomplished using a chemical mechanical polishing (CMP) step which removes only the uppermost horizontal expanses of the continuous layer. Although CMP is effective, it is a relatively complex and costly step.

Singulation may also be accomplished with a simple, inexpensive plasma etch-back step which removes all unprotected horizontal expanses of the continuous layer. By applying a photoresist layer prior to the etch-back step, the floor of the cup-shaped storage-node plate can be protected from the etch. In any case, ion bombardment during the plasma etch-back step typically results in a facet etch of the upper edge of the cup-shaped storage-node plate. This sharpening of the upper edge has two problems associated therewith. First, the sharpened edges tend to break off and cause particulate failures. Second, the sharpened edge results in a higher electric field, which can cause charge leakage between the storage-node plates and the cell plate (i.e., the other capacitor plate).

What is needed is a manufacturing process for cup-shaped capacitors which will eliminate the problem of sharpened upper edges of the storage-node plates.

SUMMARY OF THE INVENTION

This invention is a cup-shaped capacitor having an inwardly-overhanging lip on the upper edge of the cylindrical wall portion of the cup, as well as a method for making the capacitor. The overhanging lip on the upper edge prevents sharpening of the upper edge and the attendant problems. The capacitor is formed by depositing a mold layer on a substrate, depositing an etch stop layer on top of the mold layer (the etch stop layer having an etch rate that is lower than that of the mold layer), enlarging the mold layer portion of the cavity such that the mold layer is recessed beneath the edge of the etch stop layer, depositing a first capacitive layer which covers the upper surface of the etch stop layer and fully lines the cavity, performing an isotropic etch-back step which removes at least the portion of the first capacitive layer which overlies the upper surface of the etch stop layer to form a singulated first capacitive plate, removing the etch stop layer, removing at least a portion of the mold layer to expose an outer surface of the first capacitive plate, depositing a dielectric layer, and depositing a second capacitive layer.

PREFERRED EMBODIMENT OF THE INVENTION

This invention will be described in the context of the process flow of dynamic random access memory (DRAM) manufacture, as the use of this type of capacitor is particularly suited to DRAM memory cell applications.

Figure 1:
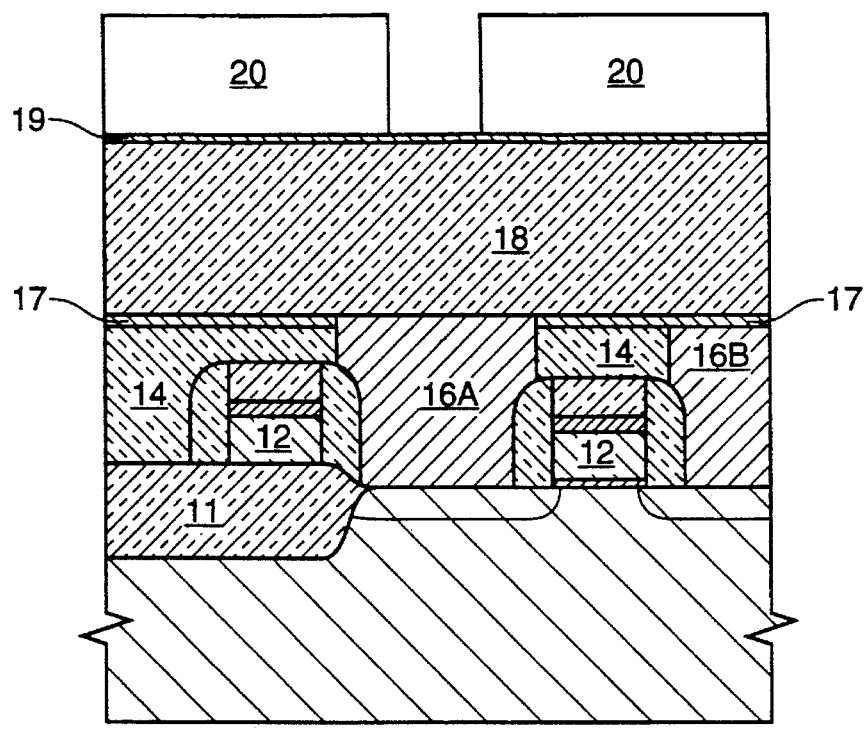
FIG. 1 is a cross-sectional view of a portion of an in-process DRAM array at a stage in the fabrication following field isolation region formation, wordline formation, and access transistor source/drain region formation, deposition of a planarizing dielectric layer, bitline contact and storage-node contact opening formation, formation of conductive plugs in both types of contact openings, deposition of a mold layer, deposition of an etch stop layer, and patterning of the array with a photoresist mask.

Referring now to FIG. 1, the process begins at a point in the DRAM manufacturing sequence that follows formation of field isolation regions 11, formation of wordlines 12, and formation of source/drain regions 13 for access transistors, the gates of which are provided by the wordlines 12. The process is facilitated by the deposition of a base dielectric layer 14, formation of storage-node contact openings and bitline contact openings in the base dielectric layer 14, and the filling of both types of openings with conductive material to form storage-node contact plugs 16A and bitline contact plugs 16B. Although polysilicon having the same dopant type as the junctions of the cell access transistor is considered to be the preferred material for the contact plugs (16A & 16B), a refractory metal such as tungsten can also be used if a barrier layer is placed between the junctions of the cell access transistor and the tungsten plugs. Following a chemical-mechanical polishing (CMP) step which planarizes the base dielectric layer so that the tops of the plugs (16A & 16B) are at approximately the same level as the upper surface of the base dielectric layer, an optional first etch stop layer 17 is deposited on the upper surface of the array. A blanket resist deposition step, followed by a plasma etch bask step may be used to replace the chemical-mechanical polishing step. A silicon nitride layer or a ceramic material layer function well as etch stop layers. In an alternate, but more complex embodiment of the invention, the base dielectric layer is planarized with a CMP step or a photoresist coat/plasma etch back step following its deposition. The first etch stop layer is then deposited, followed by the formation of contact openings and the deposition of conductive plug material. An additional CMP step or photoresist coat/plasma etch back step is then required to singulate the plugs 16A and 16B.

Still referring to FIG. 1, a mold layer 18 is deposited on top of the base dielectric layer and conductive plug structures, a second etch stop layer 19 is then deposited on top of the mold layer, and the resulting structure is patterned with a photoresist mask 20 which exposes portions of the second etch stop layer which are superjacent and vertically aligned with the storage-node contact plugs 16A. In a preferred embodiment of the invention, the base dielectric layer 14 and the mold layer 18 are borophosphosilicate glass layers, and the second etch-stop layer 19 is silicon nitride. Taken together, the mold layer 18 and the second etch-stop layer 19 shall be called the mold stratum.

Figure 2:
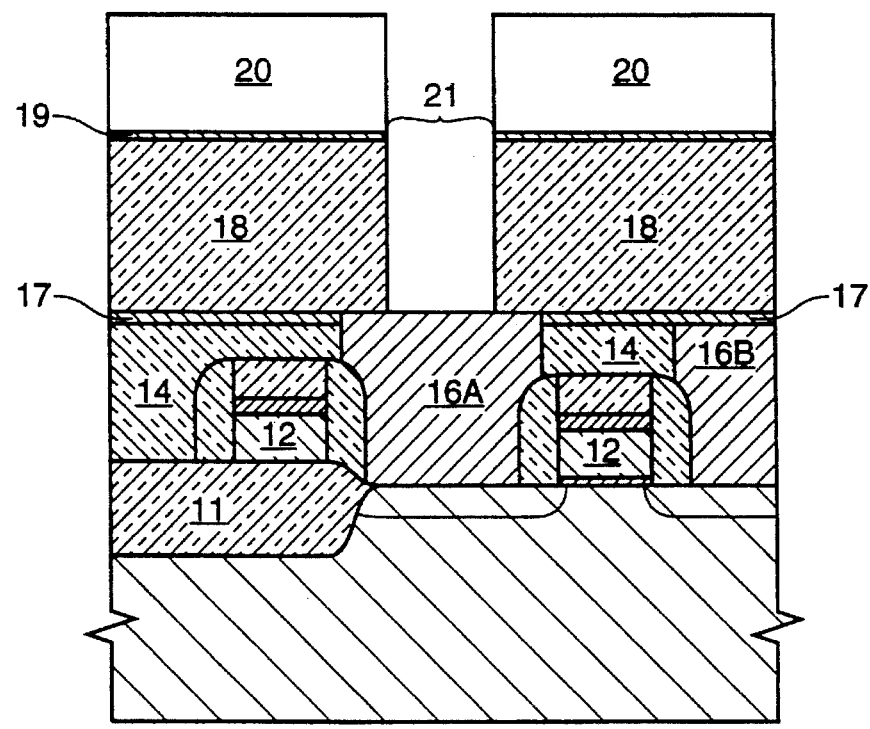
FIG. 2 is a cross-sectional view of the portion of the in-process DRAM array of FIG. 1 following an anisotropic etch through both the etch stop layer and the mold layer.

Referring now to FIG. 2, an anisotropic plasma etch has formed a vertically-oriented channel or cavity 21 which extends through the second etch stop layer 19 and through the mold layer 18 to the storage-node contact plug 16A below. Anisotropic plasma etches provide structures with sidewalls which are substantially vertical (i.e., vertical or within several degrees of being vertical). When the terms "vertical" or "normal" are used in this disclosure, exact verticality is not to be implied, as perfect geometric relationships exist only in theory.

Figure 3:
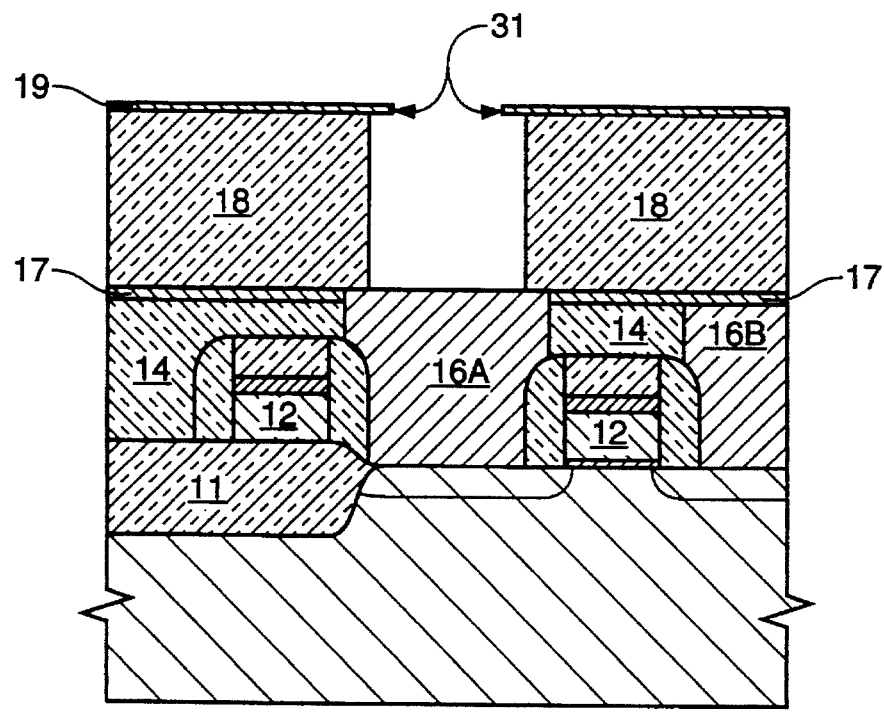
FIG. 3 is a cross-sectional view of the portion of the in-process DRAM array of FIG. 2 following an isotropic etch which recesses the mold layer beneath the edge of the etch stop layer.

Referring now to FIG. 3, an isotropic etch (e.g., a wet oxide etch) that is selective for the mold layer 18 over the second etch stop layer 19 has been performed. The mold layer 18 has become recessed beneath the edge 31 of the second etch stop layer 19, thus expanding the perimeter of the mold layer portion of cavity 21.

Figure 4:
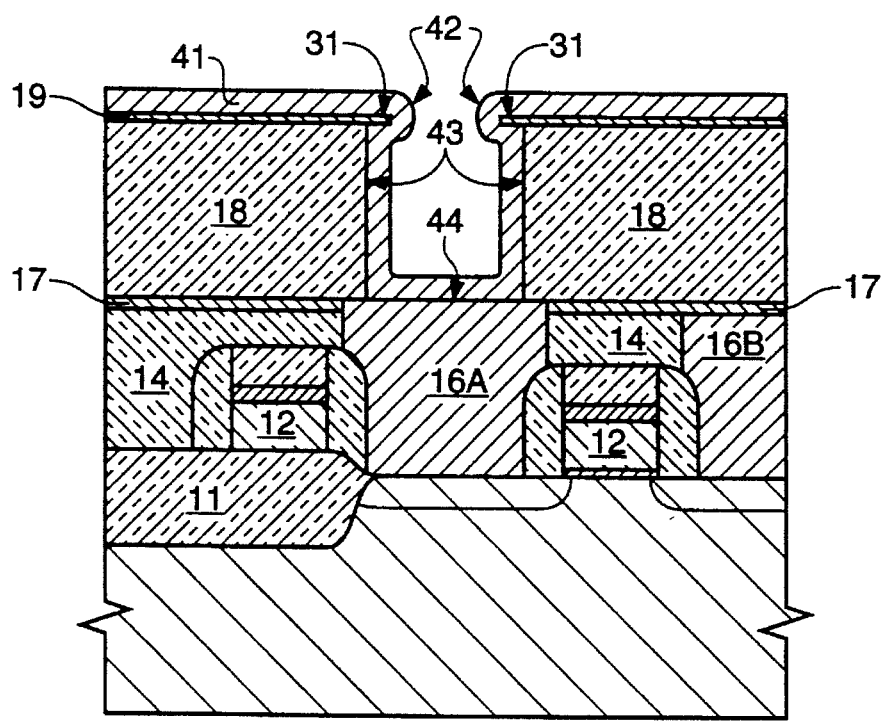
FIG. 4 is a cross-sectional view of the portion of the in-process DRAM array of FIG. 3 following the deposition of a first capacitive layer.

Referring now to FIG. 4, a first capacitive layer 41 has been blanket deposited on the exposed surface of the in-process array via chemical vapor deposition. In a preferred embodiment of the invention, this first capacitive layer 41 is amorphous silicon, as it lends itself to hemispherical grain (HSG) polycrystalline silicon growth during annealing. If HSG polycrystalline silicon is not required, the capacitive layer may be polycrystalline, rather than amorphous, silicon. It will be noted that the first capacitive layer 41 covers the upper surface of the second etch-stop layer 19, wraps around the overhanging edge 31 of the second etch stop layer 19 to form an overhanging lip 42, and conformally lines the walls 43 and floor of 44 cavity 21. It will also be noted that within the cavity 21, the first capacitive layer 41 forms a cup-shaped structure.

Figure 5:
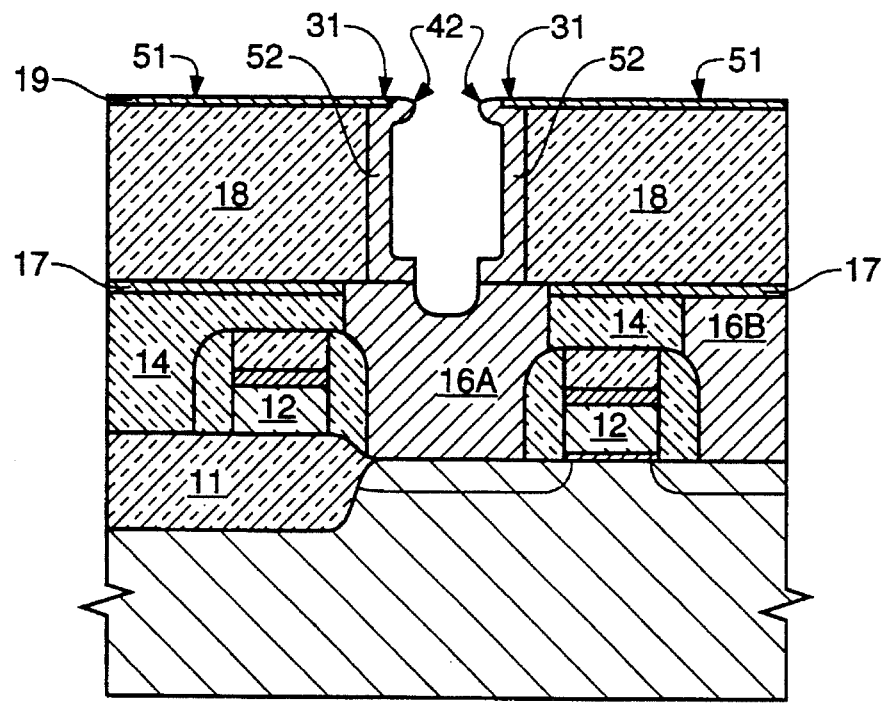
FIG. 5 is a cross-sectional view of the portion of the in-process DRAM array of FIG. 4 following an anisotropic plasma etch-back step.

Referring now to FIG. 5, an anisotropic plasma etch-back step has removed the portion of the first capacitive layer 41 that covers the upper surface of the second etch-stop layer 19, thus exposing the upper surface of the latter. The etch chemistry must, of course, be chosen so that the first capacitive layer etches selectively with respect to the second etch-stop layer 19 (i.e, the first capacitive layer etches at a significantly faster rate than the second etch-stop layer). It will be noted that a portion of the floor of the cup-shaped structure formed by the first capacitive layer 41 within cavity 21 has been etched away. In fact, the plasma etch also etched into the upper surface of storage-node contact plug 16A.

Figure 6:
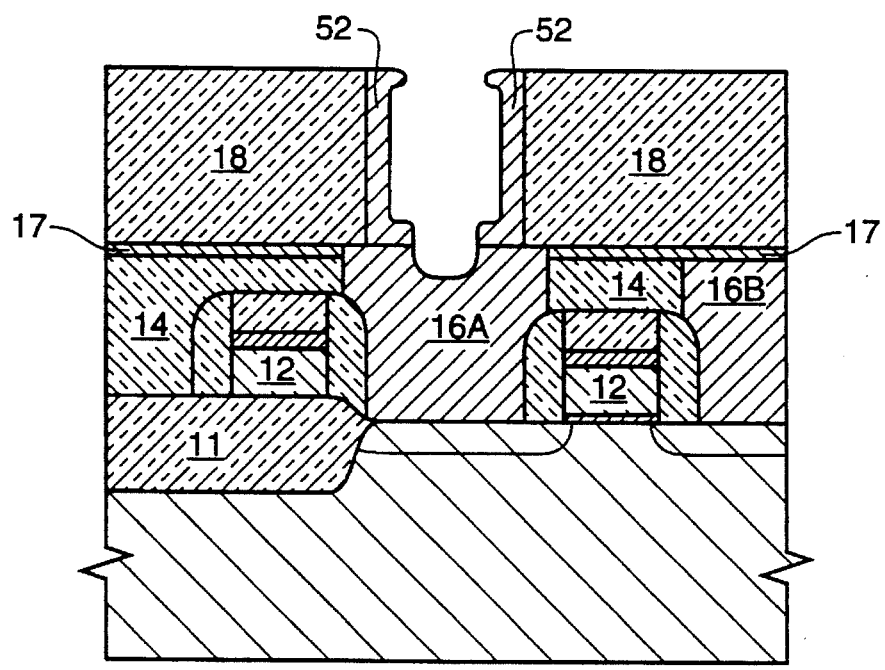
FIG. 6 is a cross-sectional view of the portion of the in-process DRAM array of FIG. 5 following removal of the etch-stop layer.

Referring now to FIG. 6, a short, timed plasma etch having low selectivity (i.e., the first capacitive layer 41 and the second etch-stop layer 19 etch at similar rates) is performed in order to remove the second etch-stop layer 19. It will be noted that a portion of the overhanging lip 42 and an additional portion of the upper surface of storage-node contact plug 17A have been etched away. Optionally, a wet etch that is selective for the second etch-stop layer 19 over the first capacitive layer 41 may replace the short, timed plasma etch of low selectivity.

Figure 7:
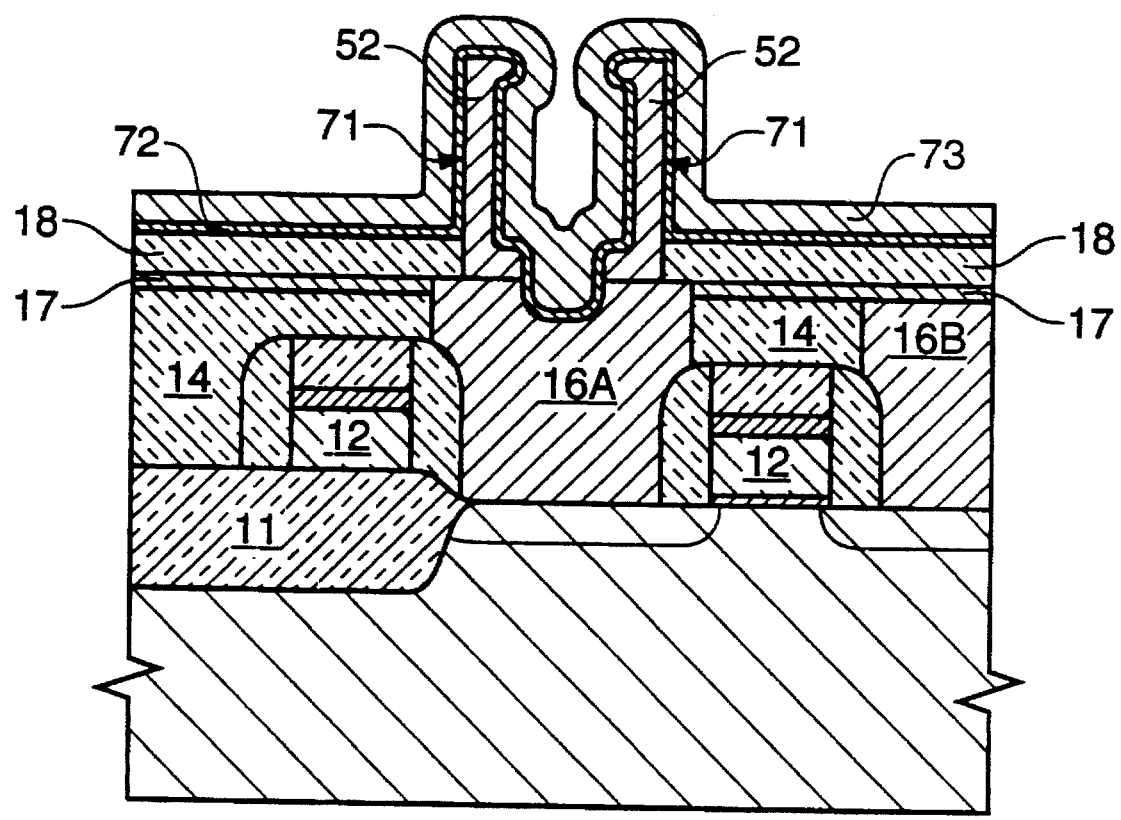
FIG. 7 is a cross-sectional view of the portion of the in-process DRAM array of FIG. 6 following removal of the mold layer, deposition of a dielectric layer, and deposition of a second capacitive layer.

Referring now to FIG. 7, the mold layer 18 has been etched away down to the level of the first etch-stop layer 17. In a preferred embodiment of the process, this is accomplished with a wet etch that is selective for BPSG over silicon (the preferred material for the first capacitive layer) and silicon nitride (the preferred etch stop layer). Following the removal of the mold layer 18, which exposes the outer surface 71 of the storage-node capacitor plate 72, a cell dielectric layer 73 is deposited or grown. A second capacitive layer 74 is deposited on top of the cell dielectric layer 73 to complete the capacitor structure. In a currently-preferred embodiment of the process, the first and second capacitive layers are polycrystalline silicon and a silicon dioxide-silicon nitride-silicon dioxide sandwich is used as the cell dielectric layer.

Although only several embodiments of the new process has been disclosed herein, it will be obvious to those having ordinary skill in the art that modification and changes may be made thereto without departing from the spirit and the scope of the process as hereinafter claimed. For example, although in a preferred embodiment of the invention, the channel etched through the mold layer has a perimetric wall that is substantially normal to the surface of the mold layer (as this will maximize capacitance of the device and protect the perimetric wall of the lower capacitor plate from the anisotropic etch used for plate singulation), a plasma etch which is only predominantly anisotropic will suffice in most cases. Furthermore, although the invention has been disclosed in the context of stacked capacitors (i.e., those fabricated at least partly above the level of the access transistor gates), it may also be applied to the formation of capacitors fabricated in the substrate. In such a case, the substrate itself substitutes for the mold layer, no first etch stop layer 17 would be necessary and the second etch stop layer 19 would be deposited directly on top of the substrate.

A vertically oriented trench is anisotropically etched adjacent each source/drain region which functions as a storage-node junction. The trench is then enlarged beneath the second etch stop layer. The trench is then lined with an insulative material (preferably silicon dioxide via either CVD deposition or thermal oxide growth). The first capacitive layer 41 is then deposited such that it lines the trench. In this case, the trench must be filled with a material such as photoresist or spin-on glass to protect the first capacitive layer 41 at the bottom of the trench during a plasma etch which removes the first capacitive layer 41 on the upper surface of the substrate and forms a singulated storage node capacitor plate within each trench. The second etch stop layer is then etched away and each storage node plate is coupled to the adjacent storage node junction with a conductive strap. A conventional strapping step will required a further deposition step and a masking and etching step. The capacitor is completed much like the stacked capacitor heretofore described.

I claim:

1. A process for forming a capacitor for use in an integrated circuit, said process comprising the following steps:
    (a) providing a mold stratum which comprises at least one layer, said mold layer having an upper surface;
    (b) forming a cavity in the mold stratum, said cavity having both a bottom portion and a perimetric wall portion, said wall portion having a perimetric, inwardly-overhanging lip at an uppermost end;
    (c) lining the cavity with a first capacitive plate layer;
    (d) forming a dielectric layer which coats at least a portion of said first capacitive plate layer; and
    (e) forming a second capacitive plate that is insulated from said first capacitive plate by said dielectric layer.

2. The process of claim 1, wherein the mold stratum is formed by depositing an etch stop layer on top of a mold layer.

3. The process of claim 2, wherein the cavity is formed via the following steps:
    (a) downwardly etching through both the etch-stop layer and the mold layer; and
    (b) performing an isotropic etch which undercuts the mold layer in the cavity beneath the etch-stop layer so that a portion of the etch-stop layer that is perimetric to the cavity forms an inwardly-overhanging lip.

4. The process of claim 3, wherein lining the cavity with a first capacitive plate layer is accomplished via the following steps:
    (a) depositing a first capacitive layer, which covers an upper surface of the etch-stop layer, wraps around the overhanging lip, and covers both the floor and wall portions of the cavity; and
    (b) performing a plasma etch which stops on the upper surface of the etch-stop layer.

5. The process of claim 4, which further comprises the step of removing the etch-stop layer following the plasma etch.

6. The process of claim 3, wherein a remaining portion of the mold layer is completely removed following removal of the etch stop layer.

7. The process of claim 1, wherein said first and second capacitive plates are formed from doped silicon layers deposited via chemical vapor deposition.

8. The process of claim 1, wherein said first capacitive plate is formed by depositing an amorphous silicon layer and subsequently annealing the amorphous silicon layer in order to convert it to a hemispherical grain polycrystalline silicon layer.

9. A process for fabricating cell capacitors for an in-process dynamic random access memory array, said in-process array having an access transistor for each cell within the array, each transistor having a pair of source/drain regions, one of which is designated as an access-node junction for bitline contact, and the other of which is designated as a storage-node junction for electrical contact to one plate of a cell capacitor, said process comprising the steps of:
    (a) depositing a mold layer over the in-process array;
    (b) depositing an etch stop layer on an upper surface of the mold layer;
    (c) forming a channel through both the etch-stop layer and the mold layer for each cell, each channel having a perimetric wall that is normal to the upper surface of the mold layer, each channel being vertically aligned with and superjacent the storage-node junction of its respective cell;
    (d) providing, at the bottom of each channel, means for making electrical contact to the subjacent storage-node junction;
    (e) performing an isotropic etch which undercuts the mold layer beneath the etch-stop layer within each channel so that a portion of the etch-stop layer that is perimetric to each channel opening forms an overhanging lip;
    (f) depositing a first capacitive layer, which covers an upper surface of the etch-stop layer, wraps around each overhanging lip, and lines the entire channel interior;
    (g) performing a plasma etch which stops on the upper surface of the etch-stop layer;
    (h) removing the etch-stop layer;
    (i) forming a cell dielectric layer; and
    (j) depositing a second capacitive layer.

10. The process of claim 9, wherein the base dielectric layer and mold layer both comprise borophosphosilicate glass.(BPSG).

11. The process of claim 9, wherein a remaining portion of the mold layer are etched away between steps (h) and (i).

12. The process of claim 9, wherein the array is coated with a planarized photoresist layer between steps (f) and (g).

13. The process of claim 9, wherein said first and second capacitive layers comprise polycrystalline silicon which is deposited via chemical vapor deposition.

14. The process of claim 9, wherein the provision of means for making electrical contact to the storage-node junction at the bottom of each mold opening includes the step of fabricating conductive plugs within a base dielectric layer which is deposited between the source/drain regions and the mold layer.

15. The process of claim 9, wherein means for making electrical contact to the storage-node junction at the bottom of each mold opening is inherent in the process, as no other layers are present between the mold layer and the storage-node junctions.

16. A process for fabricating a capacitor for use in an integrated circuit constructed on a semiconductor substrate, said process comprising the steps of:
    (a) depositing a mold layer which overlies the substrate;
    (b) depositing an etch stop layer on an upper surface of the mold layer;
    (c) downwardly etching through both the etch-stop layer and the mold layer to form a channel having a floor portion and a perimetric wall portion;

(d) performing an isotropic etch which undercuts the mold layer within the channel beneath the etch-stop layer so that a portion of the etch-stop layer that is perimetric to the channel forms an inwardly-overhanging lip;

(e) depositing a first capacitive layer, which covers an upper surface of the etch-stop layer, wraps around the overhanging lip, and covers both the floor and wall portions of the channel;

(f) performing a plasma etch which stops on the upper surface of the etch-stop layer;

(g) removing the etch-stop layer;

(h) forming a capacitor dielectric layer;

(i) depositing a second capacitive layer, said capacitive layer being insulated from a remaining portion of the first capacitive layer by the capacitor dielectric layer.

17. The process of claim 16, wherein the mold layer comprises borophosphosilicate glass.

18. The process of claim 16, wherein a remaining portion of the mold layer is etched away between steps (g) and (h).

19. The process of claim 16, wherein downwardly etching is accomplished using a predominantly anisotropic plasma etch.

20. The process of claim 16, wherein downwardly etching is accomplished using an anisotropic plasma etch.

21. The process of claim 16, wherein said first and second capacitive layers comprise silicon that is deposited via chemical vapor deposition.

22. The process of claim 21, wherein said first capacitive layer is formed by depositing an amorphous silicon layer and subsequently annealing the amorphous silicon layer in order to convert it to a hemispherical grain polycrystalline silicon layer.

* * * * *